United States Patent [19]
Critchlow

[11] Patent Number: 5,276,706
[45] Date of Patent: Jan. 4, 1994

[54] SYSTEM AND METHOD FOR MINIMIZING FREQUENCY OFFSETS BETWEEN DIGITAL COMMUNICATION STATIONS

[75] Inventor: David N. Critchlow, San Diego, Calif.

[73] Assignee: Hughes Aircraft Company, Los Angeles, Calif.

[21] Appl. No.: 886,652

[22] Filed: May 20, 1992

[51] Int. Cl.$^5$ .............. H03H 7/30; H03H 7/40; H03K 5/159; H03D 1/00
[52] U.S. Cl. ............................ 375/13; 375/96; 375/97; 375/111; 375/114
[58] Field of Search .......... 375/13, 96, 97, 111, 375/114, 116, 8, 39; 455/255, 257, 263, 265

[56] References Cited

U.S. PATENT DOCUMENTS

| | | | |
|---|---|---|---|
| 3,943,346 | 3/1976 | Urkowitz et al. | 235/152 |
| 4,644,561 | 2/1987 | Paneth et al. | |
| 4,941,155 | 7/1990 | Chuang et al. | |
| 5,068,916 | 11/1991 | Harrison et al. | |
| 5,121,414 | 6/1992 | Levine et al. | 375/96 |
| 5,150,380 | 9/1992 | Okanoue | 375/96 |

Primary Examiner—Curtis Kuntz
Assistant Examiner—Duane Kobayashi
Attorney, Agent, or Firm—Gordon R. Lindeen, III; William J. Streeter; Wanda Denson-Low

[57] ABSTRACT

A system and method for frequency acquisition by a mobile receiver 14 in a cellular communication system. Data for part of a frame 10 is sampled. Synchronization pattern 36 is rotated by a pattern rotator 37 to simulate fixed frequency offsets. The known sync pattern 36 is correlated with the sampled data by correlator 30 for a number of phase advances corresponding to the simulated fixed frequency offsets. The peak outputs 54 and 58 of the correlator 30 for the number of fixed frequency offsets is interpolated by parabolic interpolator 46 to adjust the receivers voltage controlled crystal oscillator 49 to reduce the offset.

9 Claims, 5 Drawing Sheets

SYSTEM AND METHOD FOR MINIMIZING FREQUENCY OFFSETS BETWEEN DIGITAL COMMUNICATION STATIONS

BACKGROUND OF THE INVENTION

1. Field of the Invention

The present invention relates to digital communication between two stations; and more particularly to a system and method for frequency acquisition in digital communication systems.

Although the present invention is suitable for use in many types of digital communication systems, it is particularly advantageous in cellular communication systems for determining the frequency offset between a cellsite and the local oscillator of a mobile receiver; and is described in connection therewith.

2. Discussion of Related Art

A cellular communication system is a mobile telephone service wherein radio coverage is divided into cells, each of which may cover an area in the neighborhood of one to two square miles. Each cell is assigned a number of available radio frequencies. The same frequencies or channels used in one area or cell are also used for areas that are spatially separated from one another. A mobile telephone station transmits and receives control and voice communication information to and from a base station, commonly referred to as a cellsite, located within the same cell. The base stations are controlled by a cellular system switching and control network that provides connection with the worldwide telecommunications network.

A call in progress is not interrupted as the mobile station travels from one cell location to another, since the system provides for automatic reassignment to an available time slot of an available channel within the other cell commonly referred to as a handoff.

In order to provide superior non-interfering communication and compatibility among many different base stations and mobile stations in different parts of the world, various operational and material specifications and standards were developed, which all suppliers and users are obliged to follow. For example, a mobile station that operates in the digital mode is required to use an RF band which is divided into two separate twenty-five Mhz wide segments, each consisting of eight hundred thirty-two channels. The first segment contains the mobile station transmit channels, and the second segment contains the mobile station receive channels. Thus, each transmit and receive channel is approximately thirty kilohertz or kilocycles in width.

Each channel has a frame format; that is, each channel radiates a succession of frames, each of which has a duration of forty milliseconds, and constitutes one cycle of a regularly recurring series. Each frame has six time slots, and each slot has one hundred sixty-two data symbols and a duration of 6.67 milliseconds, for example.

The term frequency offset as used herein is the difference between the frequency of the local oscillator in the mobile receiver and the frequency transmitted by the base station of the cell. In order for a demodulator in a digital cellular phone to successfully acquire a signal from a base station, the frequency offset should be less than eight hundred Hz, in that synchronization of the frame requires that the frequency offset be within eight hundred Hz in order for the bit timing to be correct. Any greater offset will result in the call being dropped if there is a transfer to another cell. This frequency offset should be reduced to within plus or minus two hundred Hz(minus the transmit/receive difference of forty-five Mhz). This two hundred Hz offset is also the maximum initial frequency offset which the demodulator automatic frequency control (AFC)loop is able to tolerate.

A frequency offset between a base station and a mobile receiver can occur for several reasons, such as difference in ambient temperature, aging of the components over a period of time, and assignment of a channel by a new base station, for example. Also, in digital to digital communication where two cellsites are at the limit of their tolerance, a handoff from one to the other can appear to be offset by as much as 610 Hz. During analog to digital handoffs, the initial frequency offset may be much larger. For example, the initial frequency in the worst case may be offset by 4500 Hz because of the tolerance of the voltage controlled oscillator.

Therefore, in order to meet the required maximum frequency offset of ±200 Hz, it is necessary that the frequency of the mobile station can be varied over a certain range to minimize any frequency offset. The carrier frequency of the receiver is determined by a voltage controlled local oscillator (VCXO) that is tunable over a certain range, such as forty-five hundred Hz. Prior to the present invention, various systems were provided for controlling the voltage of a VCXO to vary the frequency of the radio receiver. Typically, samples of the received waveform were obtained and correlated, with the VCXO being tuned in accordance with the results. If, after tuning, the frequency offset was still excessive, more samples would be taken, and the control voltage of the VCXO again would be varied by a certain amount. This process would be repeated until the offset frequency came within the desired limits.

In U.S. Pat. No. 4,644,561, a frequency acquisition routine is described that takes advantage of the period of time during which there is no transmission from the base station. At the expiration of this time the base station transmits an unmodulated carrier signal, which causes the IF mixer of the receiver to output another sine waveform whose frequency is proportional to the difference between the VCXO and the base station frequency. The modem program samples the I,Q channels at certain intervals and determines the phase change for each interval, puts it through a low pass filter and sends it as a correction word to control the VCXO. Frequency acquisition is achieved when the phase change becomes lower than a certain level.

Although suitable for the purposes intended, the methods and systems for frequency acquisition prior to the present invention tended to require costly precision voltage controlled oscillators, and the receipt of multiple frames of data in order to effect proper frequency acquisition.

SUMMARY OF THE INVENTION

One of the objects of the present invention is to provide a system and method of frequency acquisition that quickly determines the frequency offset between a base station and its own local oscillator when the mobile station is first introduced into a new cell.

Another object of the present invention is to provide a system and method of frequency acquisition that is capable of minimizing the effect of multipath conditions and fading during a handoff.

Still another object of the present invention is to provide a system and method of frequency acquisition which is not configured to utilize a plurality of frames of information in minimizing the offset frequencies.

A further object of the present invention is to provide a system and method of frequency acquisition that is able to utilize a more economical voltage controlled local oscillator that permits greater tolerance between the center frequency of the carrier and the frequency of the local oscillator of the receiver.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

To achieve the objects and in accordance with the purpose of the invention, as embodied and broadly described herein, the system of the invention for minimizing frequency offsets between digital communication channels, comprises a matched filter responsive to in-phase(I) and quadrature phase(Q) components of each of a plurality of data symbols for generating a corresponding predetermined series of pairs of I,Q symbols; a complex correlator responsive to the I,Q symbols for determining iteratively the correlation of the series of pairs of I,Q symbols with a predetermined pattern of symbols and outputting a maximum frequency value for each iteration; a pattern rotator for changing an apparent frequency of the predetermined pattern of symbols for each iteration of the correlation determination; a peak detector responsive to a predetermined number of iterations of correlation determination for detecting a peak output from the number of maximum frequency values; a parabolic interpolator governed by the detection of the peak value for generating a signal having a value corresponding to an estimate of the frequency offset; and a voltage controlled oscillator responsive to the generated signal for varying the frequency of a receiver.

In another aspect, the method of the invention for minimizing a frequency offset between a base station transmitter and a mobile receiver of a cellular communication system where each mobile station includes stored data symbols corresponding to a known synchronization pattern for receiving a communication, where each frequency channel of communication includes a series of frames, each frame includes a series of time slots, and each time slot includes a synchronization pattern of a predetermined series of data symbols, and each symbol of the pattern occurs at a symbol time interval, comprises storing in the receiver, I,Q components of a predetermined total number of data symbols of a frame transmitted by the base station; correlating iteratively a predetermined number of times the total number of stored data symbols with the known synchronization pattern of the receiver; modifying the stored synchronization pattern of the receiver to correspond to a pattern having an apparent frequency offset from a previous apparent frequency for each correlation determination iteration; detecting a maximum value for the data symbols of each iteration; calculating a value corresponding to an estimate of the frequency offset in accordance with selected ones of the detected maximum values of the predetermined number of iterations, and changing the frequency of the receiver in accordance with the calculated value.

It is to be understood that both the foregoing general description and the following detailed description are exemplary and explanatory only, and are not restrictive of the invention as claimed.

The accompanying drawings, which are incorporated in and constitute a part of this specification, illustrate one embodiment of the invention and together with the description, serve to explain the principles of the invention.

DESCRIPTION OF THE PREFERRED EMBODIMENT

Figure 8:
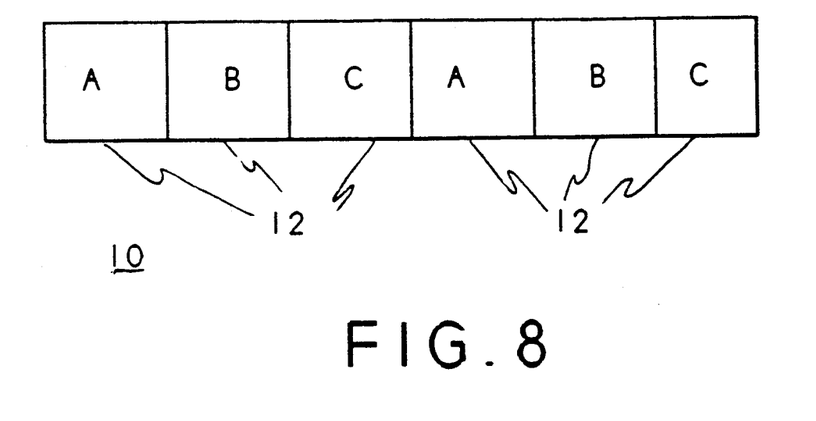
FIG. 8 is a schematic representation of a frame of a communication channel for a cellular communication system.
Figure 9:
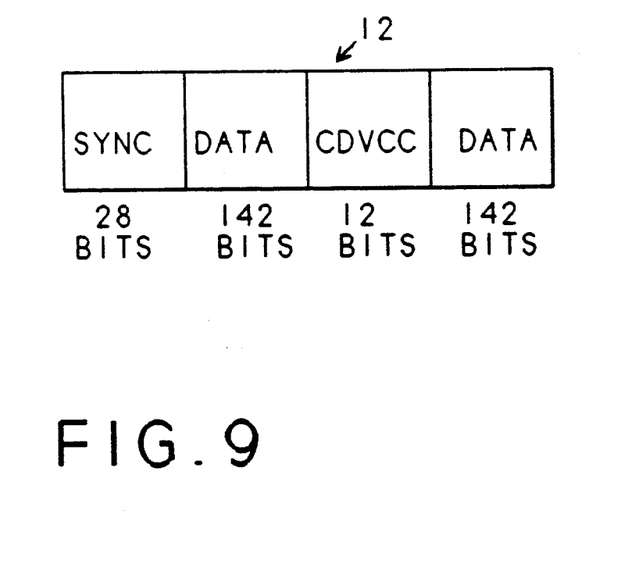
FIG. 9 is a schematic representation of a slot of the frame of FIG. 8.

Prior to discussing the system and method of the present invention; a description of the frame and slot protocol utilized in connection with a cellular system will be briefly described in connection with FIGS. 8 and 9 in order to better understand the invention. FIG. 8 illustrates a frame of information generally referred to at 10, which is transmitted every forty milliseconds or at a rate of 25 frames per second. Frame 10 has six slots, referred to as slots 12. Of the slots 12, two slots A may be used by one mobile station, two slots B another, and two slots C by a third station or subscriber for carrying on conversations simultaneously. Each slot represents an individual burst of RF energy of a duration of 6.67 milliseconds. Referring to FIG. 9, one of the slots 12 has several fields, a synchronization field SYNC, two data fields of one hundred forty-two bits each, and a coder digital verification color code CDVCC. The synchronization pattern or SYNC portion permits the mobile unit to acquire the cell data master timing reference. The present invention utilizes that first 20 millisecond or 486 symbols of each frame that includes 3 slots each having a known sync portion.

Reference will now be made in detail to the present preferred embodiment of the invention, an example of which is illustrated in the accompanying drawing. The system of the present invention is preferably implemented in software on a single fixed point digital signal processor of the well-known type used for demodulation of a digital data stream.

Wherever possible, the same reference numbers will be used throughout the drawings to refer to the same or like parts.

The system of the present invention for minimizing frequency offsets between digital communication channels includes a receiving modem for a mobile communication system which comprises a down converter, an analog to digital converter, a matched filter, an automatic gain control, a complex correlator, a sychronization pattern, a pattern rotator, a peak detector, a parabolic interpolator, and a voltage control oscillator.

Figure 1:
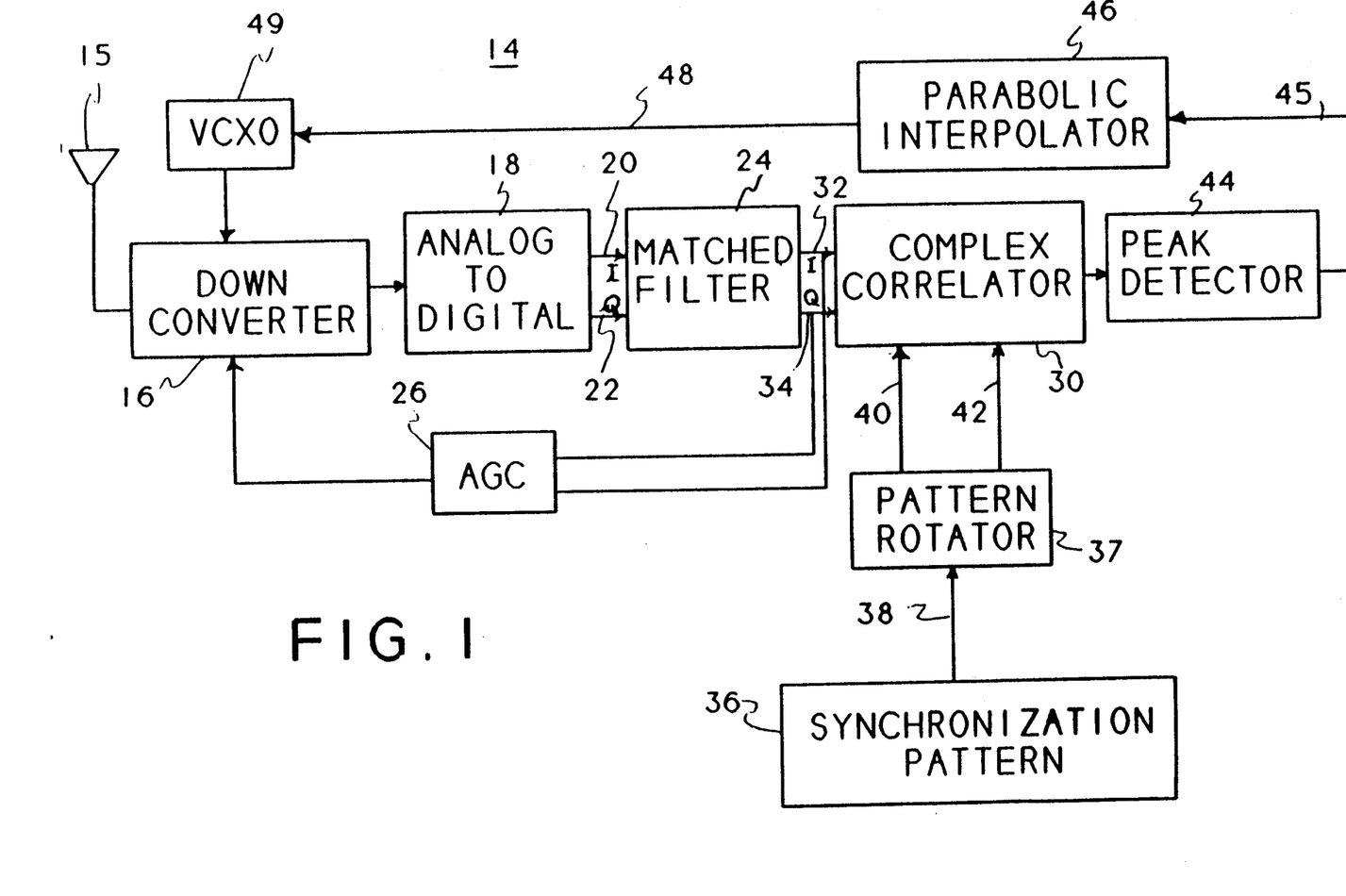
FIG. 1 is a schematic block diagram of a frequency acquisition system in accordance with one embodiment of the invention.

As herein embodied, and referring to FIG. 1, the system of the present invention is generally referred to at 14, and comprises an antenna 15 for receiving an RF frequency from a base station or cellsite (not shown) which is converted to an IF frequency at down converter 16. The IF frequency is output to an analog to digital converter 18 which outputs a pair of in-phase (I) and quadrature phase (Q) symbol components on lines 20 and 22. I and Q data samples are input to a digital matched filter 24 at the rate of two complex samples for each symbol time. Matched filter 24 includes a finite impulse response filter which samples the I,Q components at twice the sampling rate of the analog to digital converter 18. Thus, the output of the matched filter is two I,Q pairs of data symbols for each symbol time of the system. An automatic gain control circuit 26 computes the gain by a base band demodulator in order to bring the IF signal level into the converter 18 to a nominal level. The automatic gain control is computed by looking at the magnitude of the phase vector after digital filtering by filter 24. The automatic gain control value from block 26 is time averaged and output to down converter 16 in order to filter the response and reduce any noise effect.

The system of the present invention comprises a complex correlator responsive to the I,Q symbols for determining iteratively the correlation of the series of pairs of I,Q symbols with a predetermined pattern of symbols. As the correlator of the known synchronization pattern is a function of two variables time t, and frequency f C(t,f) is a three-dimension parabola with its maximum set at C(0,0). If one variable is fixed, and the second is varied, C(t,f) is a parabola in two dimensions. The frequency acquisition algorithm of the present invention utilizes the fact that for a fixed timing offset, the correlation peak will be proportional to the amount of the frequency offset between the transmitter and receiver. If the peak at various induced frequency offsets is searched, the correlator will produce a peak at the offset which is closest to the transmitter frequency.

As herein embodied, complex correlator 30 is used to determine the correlation of the incoming data stream out of matched filter 24 with a known synchronization pattern or derivative thereof represented by block 36. Correlator 30 is run at twice the symbol rate in order to correlate the I,Q, values out of the matched filter 24. Therefore, correlator input sequences are formed $I_{even}$, $Q_{even}$, $I_{odd}$, and $Q_{odd}$. Correlations are done on the even and odd sequences separately. Correlator output energies, $E_{even}$ and $E_{odd}$ are both measured every symbol time. The energies are used to normalize the correlation results, since the correlator outputs are amplitude dependent. The detection parameters $F_{even}$ and $F_{odd}$ indicate the strength of the correlation at each half symbol.

Even and odd correlator products are computed each symbol and half symbol time, and output to peak detector 44. Assuming that the synchronization pattern stored in box 36 has a length of 15 symbols, the following correlator products are created.

$$C(I)_e^k = \sum_{i=1}^{15} \alpha_i I_e^{k-i} + \beta_i Q_e^{k-i} \quad C(Q)_e^k = \sum_{i=1}^{15} \alpha_i Q_e^{k-i} - \beta_i I_e^{k-i}$$

$$C(I)_o^k = \sum_{i=1}^{15} \alpha_i I_o^{k-i} + \beta_i Q_o^{k-i} \quad C(Q)_o^k = \sum_{i=1}^{15} \alpha_i Q_o^{k-i} - \beta_i I_o^{k-Y<<}$$

In the products referenced to above the index k specifies the I,Q samples that correspond to the symbol time, thus, k is going to be running between 1 and 486 times. Thus, there is obtained a sampling of 486 pairs of I and $Q_{evens}$ and 486 pairs of I and $Q_{odds}$. $\alpha_i$ and $\beta_i$ are the rectangular coordinates of the stored synchronized pattern known to the mobile station. The i runs from 1 to 15 and corresponds to the symbols of the known synchronization pattern. Thus, every half symbol time a correlation product will be computed which is referred to as either odd or even I,Q components. C(I) of the in-phase products refers to correlator output for even symbols and odd symbols. Similarly, C(Q) refers to a correlator product for either the phase quadrature odd or even components, respectively. Since the correlator is complex and the inputs are complex, the correlator output will be a complex number. Therefore, when the correlator is run there will be four different outputs; that is, I and Q components for both the even and odd samples. The energy estimates are calculated to normalize the numbers to eliminate false results. For example, if there were a high input signal, a high output number would be obtained with little correlation, also, with a very low input signal, a very low output of the correlator could occur even though both of them were created by the synchronization pattern. Thus, the energy calculation permits the outputs to be directly proportional to the amplitude of the I,Q symbols coming in over inputs 32 and 34; thus, the normalization permits the process to ignore the amplitude of the I,Q symbols and act upon the phase of the symbols. This normalization provides additional protection that is provided by automatic gain control circuit 26 for minimizing the effect of a fading environment. The energy estimates are computed as follows:

$$E_e^k = \sum_{i=1}^{15} \left[ \{I_e\}^{\{k-i\}^2} + \{Q_e\}^{\{k-i\}^2} \right]$$

$$E_o^k = \sum_{i=1}^{15} \left[ \{I_o\}^{\{k-i\}^2} + \{Q_o\}^{\{k-i\}^2} \right]$$

The detection parameters $F_{even}$ and $F_{odd}$ at the output of the complex correlator are computed as follows:

$$F_{even}^k = \frac{\{C_e\}^{\{k\}^2}}{E_e^k} = \frac{\{C(I)_e\}^{\{k\}^2} + \{C(Q)_e\}^{\{k\}^2}}{E_e^k}$$

-continued $$F^k_{odd} = \frac{\{k\}^2}{\{C_o\}}{E_o^k} = \frac{\{k\}}{\{C(I)_o\}} + \frac{\{k\}^2}{\{C(Q)_o\}}{E_o^k}$$

In accordance with the present invention, a pattern rotator for changing an apparent frequency of the known synchronization pattern of symbols is input to the complex correlator. As herein embodied, a pattern rotator 37 has an input 38 from block 36 representing the known synchronization pattern and has outputs 40 and 42 for introducing an incrementally rotated pattern after each complete reiteration of correlator 30. Thus, pattern rotator 37 takes the known synchronization pattern sequence and rotates the symbols in order to make them appear to be frequency modulated. During each iteration, the known synchronization pattern is modulated by an induced frequency offset corresponding to a number of spaced offset frequencies. Each iteration would use a different modulation parameter on the known pattern.

The known synchronization pattern is modulated for each iteration by simply adding a fixed phase offset between each symbol of the pattern. The phase offset introduced per symbol time ($\Delta\phi$, in radians) is given below, where f symbol is equal to the inverse of the channel data rate.

$$\Delta\phi = \frac{2\pi\Delta f_n}{f_{symbol}}$$

Given a known synchronization pattern: $\{\alpha_i, \beta_i\}$ A modulated synchronization pattern is for $i=0,1,\ldots15$:

$$(\alpha_i, \beta_i) \cdot e^{j(i\Delta\phi)}$$

For example, we can perform the process three times looking for the peak values in frequency steps of 500 Hz. In this case, we would perform the iterations three times for $\Delta f = -500, 0,$ and $500$. Corresponding phase increments per symbol time would be $-0.1292, 0.0 + 0.1292$.

In other words, the synch pattern rotator adds an increment of phase to the synchronization pattern at each symbol time, and half symbol time, to simulate a predetermined frequency offset. For example, for a first iteration of the correlator, the synchronization pattern is set to zero, with no offset. For the next iteration, a delta f ($\Delta f$) is added to the first symbol of the known synchronization pattern, a $2\Delta f$, is added to the second symbol, a $3\Delta f$ is added to the third symbol until the last symbol of the known synchronization pattern has been incremented to ($15\Delta f$) for a fifteen symbol pattern. After a first correlation of the series of $I,Q_{odd}$ and $I,-Q_{even}$ pairs, another value of delta f, such as $\Delta f2, \Delta f3$, is added to the fifteen symbols of the known synchronization pattern that represents another frequency offset from the first iteration. In one actual embodiment, the incremental phase of each symbol of the known synchronization pattern corresponds to a differential of plus or minus five hundred Hz for each iteration of the $I_{even}, I_{odd}, Q_{even}$ and $Q_{odd}$ components of the 486 sampled data symbols. Thus, with maximum offset of 4500 Hz for the worst cases the frequency acquisition within the required limits can be accomplished in 19 iterations involving only one sampling operation.

Thus, the correlation process for all the gathered symbols of a frame is repeated N times for N number of predetermined frequencies for each iteration. The only change after each iteration of the collected symbols is the amount of artificial frequency offset introduced into the known synchronization pattern. The number of different fixed frequency steps $\Delta n$ over the required frequency change is dictated by the acquisition mode; that is, either Analog to Digital or Digital to Digital.

Figure 4:
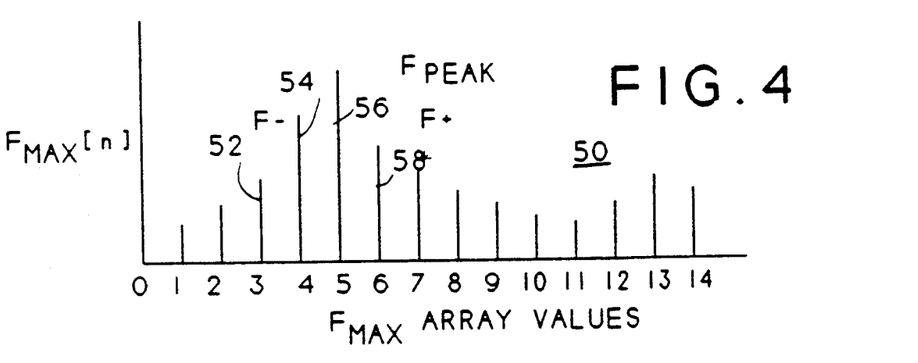
FIG. 4 is a diagrammatic representation of an array of maximum correlation values corresponding to successive iterations.

In accordance with the present invention, the system includes a peak detector which is responsive to a predetermined number of iterations of the correlator for detecting a peak output from the number of maximum frequency values. As herein embodied and referring to FIG. 1, a peak detector 44 is connected to the output of complex correlator 30, which stores the $F_{max}$ of each iteration in an array for selection of the $F_{peak}$ therefrom. Referring to FIG. 4, an array referred to as 50 stores the maximum output of each iteration. For example, a vertical line 52 represents the maximum value of an iteration of the system. Vertical line 54 represents the $F_{max}$ of the fourth iteration of the complex correlator; and as previously described the value 52 is obtained for a different simulated offset frequency than the value 54. Similarly, line 56 represents for a fifth iteration, and vertical line 58 represents $F_{max}$ for a sixth iteration obtained from a still different fixed frequency offset than the iterations at generated lines 56, 54, and 52. The vertical lines 52, 54, 56, and 58 are all referred to as a maximum frequency ($F_{max}$) herein, and the line 56 which has the greatest value of the array is referred to herein as the peak detected frequency $F_{peak}$.

In accordance with the present invention, the system includes a parabolic interpolator governed by the detection of the peak value of the array for generating a signal having a value corresponding to an estimate of the frequency offset. As herein embodied and referring to FIG. 1, a parabolic interpolator 46 is connected to output 45 of the peak detector. Referring to FIG. 4, the frequency offset is estimated based on $F_{max}$ correlator outputs surrounding the chosen peak $F_{peak}$.

The parabolic interpolator module 46 does a best fit estimate of the actual frequency offset based on correlator output for a fixed frequency step size. Interpolator output on line 48 drives VCXO 49 to the correct frequency, thus, aligning the receiver frequency reference with that of the cell site or base station transmitter.

In accordance with the invention, fixed offsets are selected and then interpolated to provide the estimation that will meet the requirements. When a fade occurs in the receiver during reception of a synchronization pattern, a large frequency deviation may be induced over the synchronization pattern that may be interpreted incorrectly as a fixed frequency error. Since the correlator peak tends to either remain above threshold or below threshold during a fade, it is preferable to throw away estimates that may have been derived during the fade. Thus, if the $F_{peak}$ does not exceed a threshold value, the process will start over.

The system and method of the present invention will be described in more detail in connection with the operation of the system of FIG. 1 with reference to FIGS. 2 through 7 herein.

Figure 2:
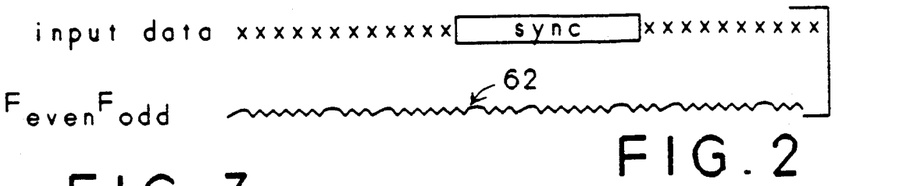
FIG. 2 is a diagram representative of the output of the complex correlator of FIG. 1 with minimum correlation between the known synchronization pattern of the receiver and the frame of data transmitted by the base station.
Figure 3:
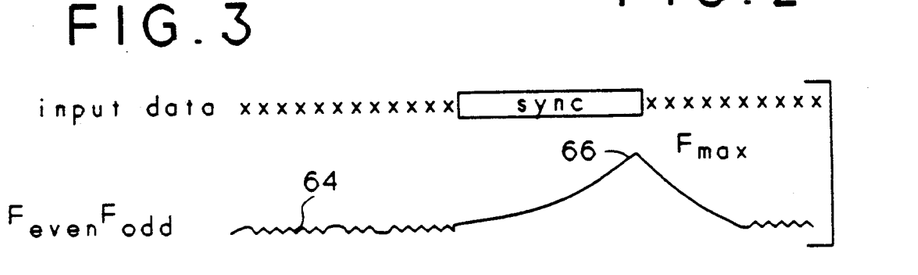
FIG. 3 is a diagram representative of the output of the complex correlator of FIG. 1 with some correlation between the known synchronization pattern of the receiver and the frame of data transmitted by the base station.

If the input sequences of I's and Q's match the synchronization pattern, the output of the correlator will be a large value. If there is no match, the value will be low. As continuous data symbols are input to complex correlator 30, it is compared to the known synchronization pattern. For most of each slot, the output of the correlator will be small. When the correlator is filled with data that corresponds to the synchronization pattern, it will output a value referred to as $F_{max}$. Referring to FIG. 2, waveform 62 represents the output of the correlator when there is little or no match between the synchronization portion of a slot and the known synchronization pattern, which may be caused by fading. Referring to FIG. 3, waveform shows the correlator output increasing in value as the synchronization portion of the data is correlated until it reaches maximum at 66 of the waveform. As previously mentioned, since two pairs of I,Q waveforms are correlated there will be two $F_{max}$ waveforms for each correlation of a slot having the synchronization pattern. The maximum of the $F_{even}$ and $F_{odd}$ that occur over the 20 milliseconds of frame length are stored and referred to as $F_{max}$ (see FIG. 4). If there is no frequency offset between the cellsite and the mobile receiver, then $F_{max}$ will be a value approximate to fifteen, which is the symbol length of the frame pattern. Since the present system is a differential system, fourteen phase differential implies that fifteen phases are transmitted, resulting in fourteen transitions. If the frequency offset is not zero, $F_{max}$ for each iteration will decrease. Between symbols, the phase will increase by more than the phase shift can advance. A frequency offset causes a phase increase of the samples also. By the end of the synchronization pattern, the phase of the offset frequency will be advanced more than the transmitted phase. Thus, the correlator output will be smaller since the input is not a perfect match. If the frequency is off too much, the $F_{peak}$ at the array of $F_{max}$ cannot be distinguished. By artificially modulating the known synchronization pattern input to the correlator, a near perfect match can be obtained. If we know what phase advance to expect per symbol, we can advance the phase of the known synchronization pattern. If they match $F_{max}$ will be large.

Referring to FIG. 4, if the known pattern is advanced by exactly the frequency offset of the input data, then $F_{peak}$ 56 will be fifteen. If advanced by not quite enough, $F_{max}$ will be smaller. If the values of $F_{max}$ are known for different frequency offsets like points 54, 56, and 58 of FIG. 4, the parabolic interpolation as previously described may be carried out.

Figure 6:
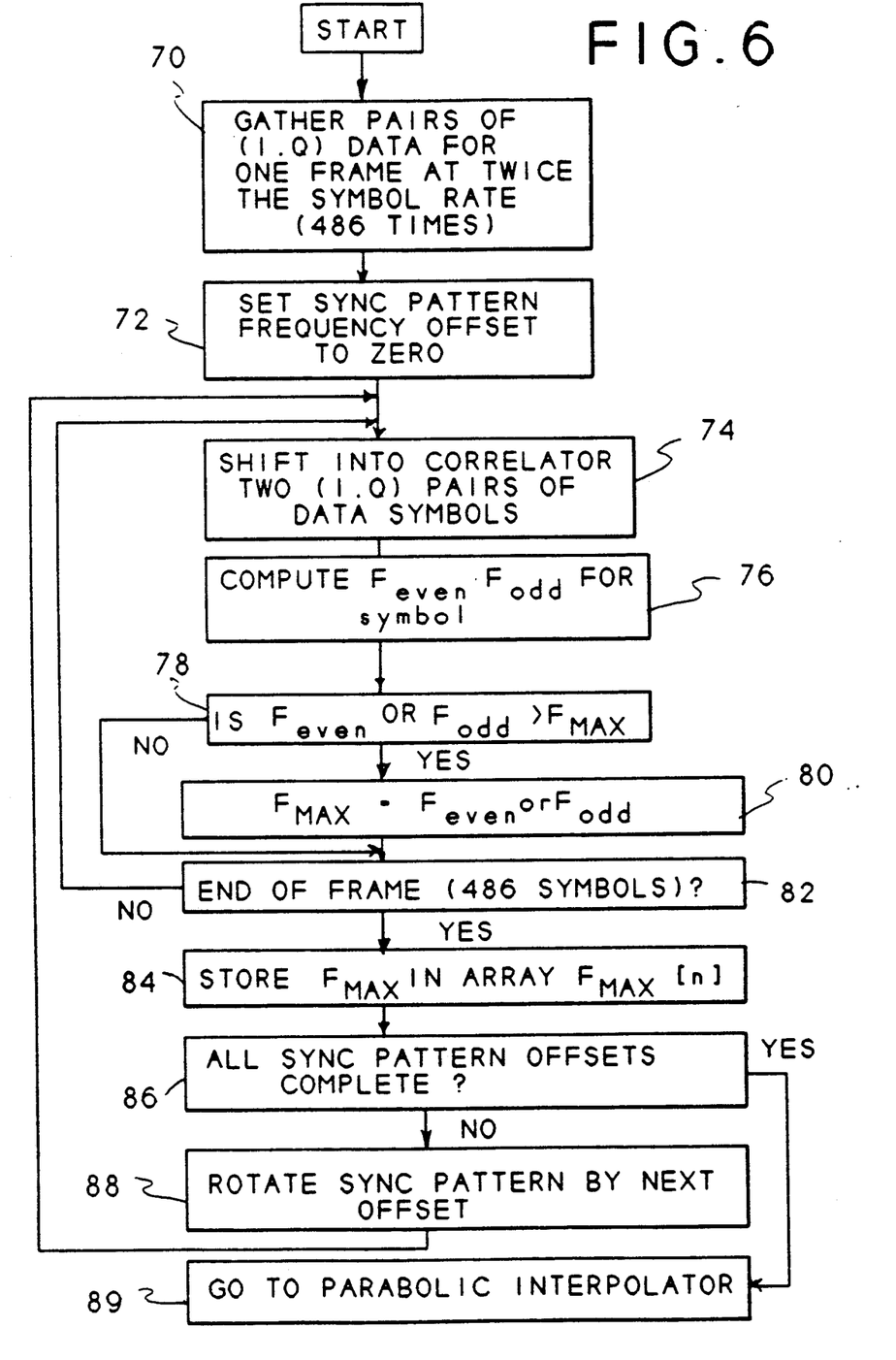
FIG. 6 is a flowchart illustrating the steps for the complex correlation of the data symbols in accordance with the present invention.

Referring to FIG. 6, upon commencement of the acquisition routine, data is received and gathered from one frame as noted at step 70. The data is buffered and stored during 486 symbol times which corresponds to twenty milliseconds and constitutes three slots or bursts of a frame. The rate of storing is twice the symbol rate. The known synchronization pattern is set to zero offset by pattern rotator 37 as noted at step 72. The routine then shifts two (I,Q) pairs of the stored data into the correlator as noted at block 74. Then, the $F_{even}$ and $F_{odd}$ symbol values are computed at step 76. The correlated symbols $F_{even}$ and $F_{odd}$ are compared with a max value. If $F_{even}$ or $F_{odd}$ is greater than $F_{max}$ as noted at step 78, the maximum of the correlated value $F_{even}$ or $F_{odd}$ is determined to be the $F_{max}$ for that particular symbol time as noted by step 80.

At step 82 the output is counted to determine whether or not the correlation was completed for the symbols of that frame. If not, the next two pair of I,Q symbols are shifted into the correlator at step 74 and the output is compared to the previous $F_{max}$ calculated from the prior correlation. If the output of the correlator for the current calculation is greater than the $F_{max}$ for the previous correlation, then the current $F_{max}$ is substituted for the previous $F_{max}$ and the program shifts the next two pairs of I,Q symbols into the correlator. This process continues until the data for all 486 symbols has been correlated as determined by step 82. In the event the correlator output for subsequent symbols is less than a previous symbol, then the previous $F_{max}$ remains as the $F_{max}$, and the next two pairs of samples are shifted into the correlator.

At the end of a frame, the largest $F_{max}$ of all the correlations is then stored in an array as shown by step 84, which completes a single iteration. The routine then checks at step 86 to determine if all of the predetermined offsets of the known synchronization pattern have been completed. If not, the pattern is rotated one frequency offset increment at step 88 and the next iteration commences at block 74. When all the symbols have been correlated with the synchronization pattern that has been modulated with all the fixed offsets, then $F_{max}$ values of the array are used by the parabolic interpolator.

Figure 7:
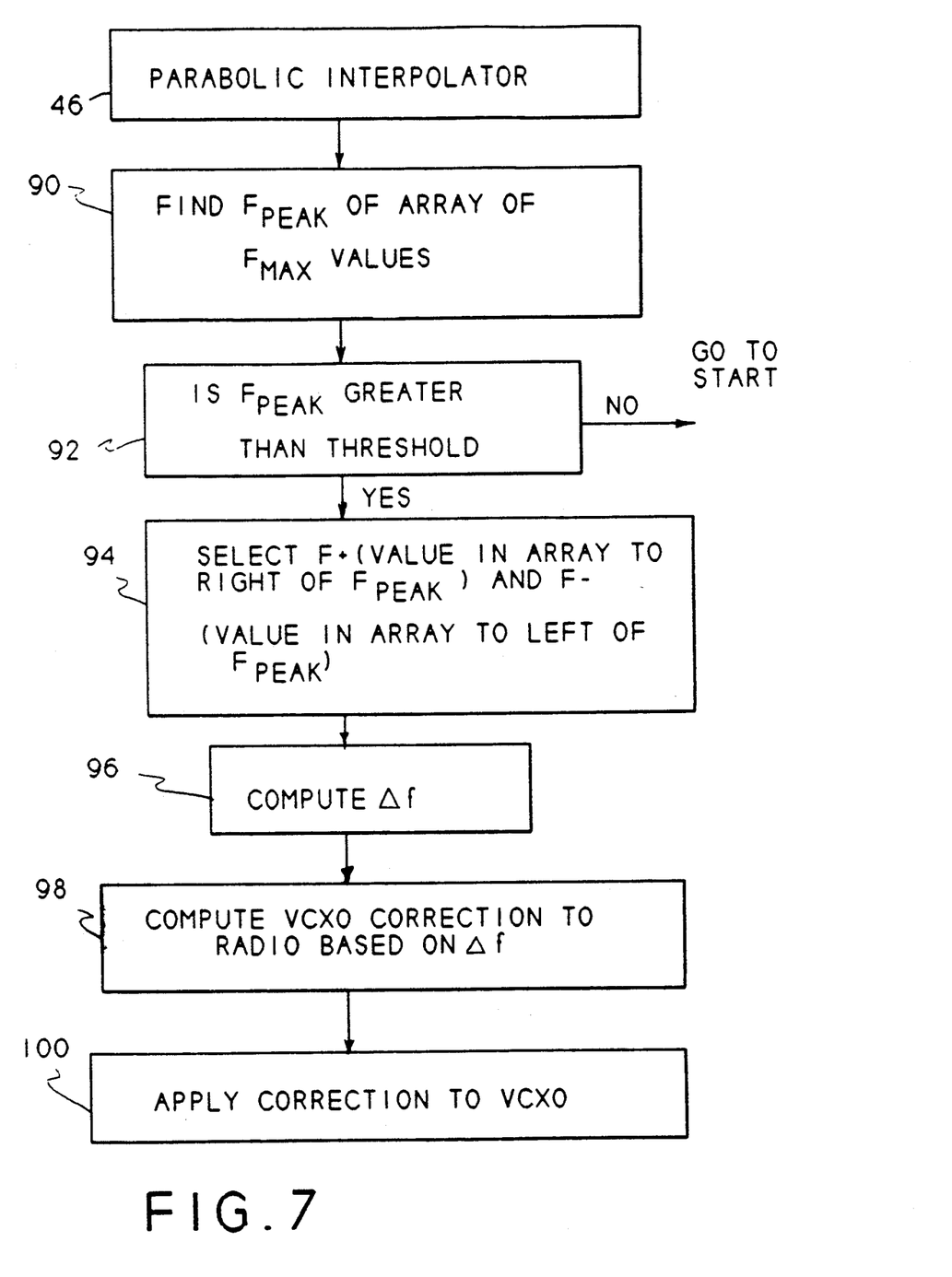
FIG. 7 is a flowchart illustrating the steps for the parabolic interpolation of the maximum values of each iteration of correlation determination.

Referring to FIG. 7, the parabolic interpolator finds the maximum value of array $F_{max}[N]$ and designates it $F_{peak}$ at step 90. It then compares $F_{peak}$ with a threshold value at step 92 and if it is not greater, the progress goes back to start of FIG. 5 and gathers data from another burst. This prevents erroneous information from occurring during a fading or in the presence of additive white gaussian noise.

If line 56 of FIG. 4 does not have a value that exceeds a predetermined fixed threshold value, then the complete process is repeated for a new buffer of data from another incoming burst. The fixed predetermined threshold will no be exceeded if there is an extraordinary amount of noise or a fading occurring during the synchronization pattern. Preferably, the threshold is determined by measuring the largest correlator output with only the noise at the correlator inputs. A repetition of the correlation process over a number of full frames would be quite time intensive. In order to decrease the total computation time, only that portion of the burst where the actual peak is present is utilized. For example, if during any burst, a peak value $F_{peak}$ exceeds the threshold, the location of the peak symbol; that is, where such peak symbol is in the string of data, is stored in memory. Then for successive correlations, the number of symbols correlated may have a length of fifteen or twenty, for example. The other one hundred fifty or so symbols of data are discarded. Therefore, the process of the present invention should begin with frequency offsets of 0 Hz; and progress outwardly to the threshold of coverage, since there is a better chance that a synchronization word will exceed threshold close to nominal rather than at the edges of the tuning band.

Figure 5:
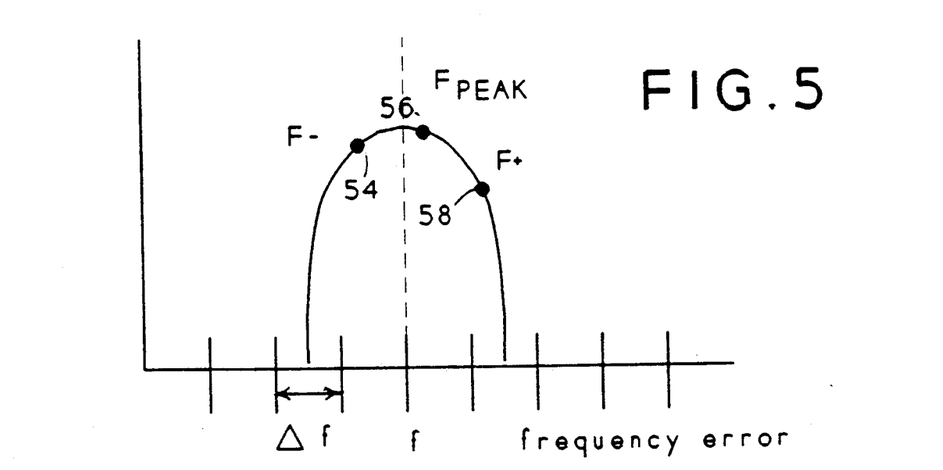
FIG. 5 is a parabolic curve with correlated values for distinct frequency offsets of the receiver's synchronization pattern.

If $F_{peak}$ is greater than the threshold value, the value $F+$ and $F-$ to the left and the right of $F_{peak}$ as shown in FIGS. 4 and 5 are selected at step 94, and the frequency offset estimate $\Delta f$ is computed at step 96. The VCXO correction value is calculated at step 98 based upon the computation of step 96. Then the VCXO correction value from step 98 is applied to the radio as noted at step 100 to minimize the offset frequency.

Based on the distribution of $F_{peak}$ and its surrounding values, the timing offset is estimated by means of a parabolic fit.

The error estimate is found with the equation:

$$\bar{\delta f} = \frac{\Delta f}{2} \cdot \left[ \frac{(F^+ - F)}{2F_{peak} - (F^+ + F)} \right]$$

The error estimate is then scaled by a constant value and then output on line 48 to a voltage controlled oscillator 49. The received frequency error is corrected as the VCXO 48 is adjusted.

In order to find the peak throughout the complete frame, a running peak is computed over all symbols k as set forth below:

$$F_{max}^k = \text{MAX}[F_{odd}^k, F_{even}^k, F_{max}^{k-1}]$$

Having described the presently preferred system embodiment and method of the invention, additional advantages and modifications will readily occur to those skilled in the art. For example, more or less iterations may be used in determining the $F_{peak}$, and the degree of rotation of the known pattern may be moved. Accordingly, the invention in its broader aspects is not limited to specific details, representative apparatus and illustrative examples shown and described. Departure may be made from such details without departing from the spirit or scope of the general inventive concept as defined by the appended claims and their equivalents.

What is claimed is:

1. A system for minimizing frequency offsets between digital communication channels, comprising:
    a matched filter responsive to in-phase(I) and quadrature phase(Q) components of each of a plurality of data symbols for generating a corresponding predetermined series of pairs of I,Q symbols;
    a complex correlator responsive to the I,Q symbols for determining iteratively the correlation of the series of pairs of I,Q symbols with a predetermined pattern of symbols to output a maximum value during each iteration;
    a pattern rotator for changing an apparent frequency of the predetermined pattern of symbols for each iteration of the correlation determination;
    a peak detector responsive to a predetermined number of iterations for detecting a peak output from each of the maximum outputs of a single iteration;
    a parabolic interpolator responsive to the detection of the maximum outputs for generating a signal having a value corresponding to an estimate of the frequency offset; and
    a voltage controlled oscillator responsive to the generated signal for varying the frequency of a system.

2. The system of claim 1 wherein the generated series of pairs of the matched filter is twice the number of in-phase(I) and quadrature phase(Q) components of the plurality of data symbols.

3. The system of claim 1 wherein the matched filter includes a finite impulse response filter.

4. A system for minimizing a frequency offset between a base station transmitter and a mobile, receiver of a cellular communication system where each receiver includes a known synchronization pattern, each frequency channel includes a series of frames, each frame includes a series of time slots, and each time slot includes a synchronization pattern of a predetermined series of data symbols, each symbol of the series occurring at a symbol time interval, said system comprising:
    a matched filter responsive to in-phase(I) and quadrature phase(Q) components of each of the series of data symbols of the received synchronization pattern for generating a predetermined total of symbols corresponding to at least two pairs of I,Q symbols during each symbol time interval of the synchronization pattern;
    a complex correlator responsive to the filtered I,Q symbols for determining iteratively the correlation of the received synchronization pattern with the known synchronization pattern;
    a pattern rotator for changing an apparent frequency of the known synchronization pattern of symbols for each iteration of correlation determination;
    a peak detector responsive to each iteration of correlation determination for detecting a maximum output of the symbols of a respective iteration;
    a parabolic interpolator for generating a signal having a value corresponding to an estimate of the frequency offset of the mobile receiver in accordance with selected maximum outputs of the iterations; and
    a voltage controlled oscillator responsive to the generated signal for varying the frequency of the receiver.

5. The system of claim 4 wherein the matched filter includes a finite impulse response filter.

6. A method of minimizing a frequency offset between a base station transmitter and a mobile receiver of a cellular communication system where each mobile station includes stored data symbols corresponding to a known synchronization pattern for receiving a communication, each frequency channel of communication includes a series of frames, each frame includes a series of time slots, and each time slot includes a synchronization pattern of a predetermined series of data symbols, each symbol of the pattern occurring at a symbol time interval, said method comprising:
    storing in the receiver I,Q components of a predetermined total number of data symbols of a time slot received from the base station;
    correlating iteratively a predetermined number of times the total number of stored data symbols with the synchronization pattern of the receiver;
    changing the synchronization pattern of the receiver to correspond to a pattern having an apparent frequency offset from a previous apparent frequency for each correlation determination iteration;
    detecting a maximum value for the total number of data symbols for each iteration;
    calculating a value corresponding to an estimate of the frequency offset in accordance with the detected maximum values of the predetermined number of iterations, and
    changing the frequency of the receiver in accordance with the calculated value.

7. The method of claim 6 wherein the step of storing the I,Q symbols includes the substeps of filtering each pair of I,Q components twice during each symbol time interval to obtain an even symbol output at each symbol time and an odd symbol output between each symbol time.

8. The method of claim 6 wherein the step of correlating includes the substeps of computing the values of the even symbol and odd symbol outputs, and the step of detecting the maximum value includes the substep of selecting a maximum value from the computed values of the respective symbols for each iteration.

9. The method of claim 8 wherein the step of calculating comprises the substep of storing the maximum value for each correlation determination iteration in an array, determining a peak value corresponding to the largest maximum value of the array, selecting stored maximum values corresponding to the correlation iteration prior and subsequent to the correlation iteration of the peak value, and determining the frequency offset estimate in accordance with the selected stored values.

* * * * *